(12) United States Patent
Yanagi et al.

(10) Patent No.: US 11,114,571 B2
(45) Date of Patent: Sep. 7, 2021

(54) SEMICONDUCTOR DEVICE AND METHOD FOR MANUFACTURING SAME

(71) Applicant: DENSO CORPORATION, Kariya (JP)

(72) Inventors: Shinichirou Yanagi, Kariya (JP); Yusuke Nonaka, Kariya (JP); Seiji Noma, Kariya (JP); Shinya Sakurai, Kariya (JP); Shogo Ikeura, Kariya (JP); Atsushi Kasahara, Kariya (JP); Shin Takizawa, Kariya (JP)

(73) Assignee: DENSO CORPORATION, Kariya (JP)

(*) Notice: Subject to any disclaimer, the term of this patent is extended or adjusted under 35 U.S.C. 154(b) by 48 days.

(21) Appl. No.: 16/368,026

(22) Filed: Mar. 28, 2019

(65) Prior Publication Data

US 2019/0229219 A1     Jul. 25, 2019

Related U.S. Application Data

(63) Continuation of application No. PCT/JP2017/036055, filed on Oct. 4, 2017.

(30) Foreign Application Priority Data

Oct. 18, 2016 (JP) .............................. JP2016-204668
Apr. 6, 2017 (JP) ................................ JP2017-76087

(51) Int. Cl.
*H01L 29/866* (2006.01)
*H01L 29/06* (2006.01)
(Continued)

(52) U.S. Cl.
CPC .......... *H01L 29/866* (2013.01); *H01L 21/223* (2013.01); *H01L 21/265* (2013.01);
(Continued)

(58) Field of Classification Search
CPC . H01L 29/866; H01L 29/861; H01L 29/0688; H01L 29/0684; H01L 29/06;
(Continued)

(56) References Cited

U.S. PATENT DOCUMENTS 4,323,909 A * 4/1982 Valdmann ............. H01L 29/868
                                                              257/438
4,419,681 A   12/1983 Schmitz
(Continued)

FOREIGN PATENT DOCUMENTS

JP         2002-057349 A    2/2002

*Primary Examiner* — Shih Tsun A Chou
(74) *Attorney, Agent, or Firm* — Posz Law Group, PLC (57) ABSTRACT

A semiconductor device includes: a semiconductor substrate having a diode formation region; an upper diffusion region of a first conductivity type provided on a surface layer of a main surface of the semiconductor substrate in the diode formation region; and a lower diffusion region of a second conductivity type provided at a position deeper than the upper diffusion region with respect to the main surface in a depth direction of the semiconductor substrate, the lower diffusion region having a higher impurity concentration as compared to the semiconductor substrate. The lower diffusion region provides a PN joint surface with the upper diffusion region at a position deeper than the main surface, and has a maximum point indicating a maximum concentration in an impurity concentration profile of the lower diffusion region in the diode formation region.

10 Claims, 6 Drawing Sheets

(51) Int. Cl.
*H01L 21/265* (2006.01)
*H01L 21/223* (2006.01)
*H01L 29/868* (2006.01)
*H01L 29/66* (2006.01)
*H01L 29/861* (2006.01)

(52) U.S. Cl.
CPC .... *H01L 29/0688* (2013.01); *H01L 29/66106* (2013.01); *H01L 29/868* (2013.01); *H01L 29/0692* (2013.01); *H01L 29/8611* (2013.01)

(58) Field of Classification Search
CPC ............. H01L 29/0611; H01L 29/0626; H01L 29/0615; H01L 29/0692
See application file for complete search history.

(56) References Cited

U.S. PATENT DOCUMENTS

| | | | |
|---|---|---|---|
| 4,951,109 A * | 8/1990 | Bechteler | H01L 29/102 257/131 |
| 5,444,328 A * | 8/1995 | Van Zutphen | H01J 1/308 257/10 |
| 5,691,558 A | 11/1997 | Davies | |
| 5,760,450 A * | 6/1998 | Hurkx | H01L 27/0814 257/106 |
| 2006/0255411 A1 | 11/2006 | Suzuki et al. | |
| 2007/0018283 A1 | 1/2007 | Fujii | |
| 2008/0179663 A1* | 7/2008 | Terashima | H01L 29/063 257/328 |
| 2010/0244194 A1 | 9/2010 | Masada et al. | |
| 2013/0189832 A1 | 7/2013 | Masada et al. | |

* cited by examiner

SEMICONDUCTOR DEVICE AND METHOD FOR MANUFACTURING SAME

CROSS REFERENCE TO RELATED APPLICATIONS

The present application is a continuation application of International Patent Application No. PCT/JP2017/036055 filed on Oct. 4, 2017, which designated the U.S. and claims the benefit of priority from Japanese Patent Application No. 2016-204668 filed on Oct. 18, 2016 and Japanese Patent Application No. 2017-076087 filed on Apr. 6, 2017. The entire disclosures of all of the above applications are incorporated herein by reference.

TECHNICAL FIELD

The present disclosure relates to a semiconductor device and a method for manufacturing the semiconductor device.

BACKGROUND

A constant-voltage power supply using a Zener diode has been known. A constant-voltage power supply has been used for a monitoring IC for a battery mounted on, for example, a vehicle, but voltage control with a higher accuracy is required to supply power to, for example, an IC.

SUMMARY

The present disclosure provides a semiconductor device including a Zener diode and a method for manufacturing the semiconductor device.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Conventionally, in a PN junction between an epitaxial layer of N-conductivity type and a diffusion layer of P-conductivity type, Zener voltage is uniquely determined depending on concentration of the two layers. In a semiconductor device, a semiconductor substrate is provided with a first diffusion region and a second diffusion region to thereby make it possible to optionally control impurity concentration in the two diffusion regions related to a PN junction. Desired Zener properties are supposed to be obtained by controlling impurity concentration in the diffusion regions.

Incidentally, it has been known that temporal fluctuation due to breakdown occurs in Zener voltage. This property fluctuation probably occurs due to hot carrier generated by breakdown phenomenon being trapped on a surface defect of the semiconductor substrate.

In the semiconductor device described above, in the joint portion where the first diffusion region and the second diffusion region are overlapped, breakdown voltage due to the overlapping is supposed to be lowered. Breakdown is supposed to occur at a portion corresponding to the overlapping. In such a structure, the portion corresponding to the overlapping is a region existing in a 3-dimensional manner, and breakdown phenomenon occurs somewhere in the 3-dimensional region, but the position is indefinite. That is, an accurate position where breakdown occurs cannot be controlled.

Generation of hot carrier and trapped state of the hot carrier to a surface defect differ depending on the position where breakdown occurs, so that indetermination of generation position of breakdown results in increasing of temporal variation of Zener voltage. Temporal fluctuation of Zener voltage may distort accurate voltage control.

A semiconductor device according to the first aspect of the present disclosure includes: a semiconductor substrate having a diode formation region; an upper diffusion region of a first conductivity type provided on a surface layer of a main surface of the semiconductor substrate in the diode formation region; and a lower diffusion region of a second conductivity type provided at a position deeper than the upper diffusion region with respect to the main surface in a depth direction of the semiconductor substrate, the lower diffusion region having a higher impurity concentration as compared to the semiconductor substrate. The lower diffusion region provides a PN joint surface with the upper diffusion region at a position deeper than the main surface, and has a maximum point indicating a maximum concentration in an impurity concentration profile of the lower diffusion region in the diode formation region.

This makes it possible to increase electric field in the maximum point of impurity concentration in the lower diffusion region, making it possible to make breakdown phenomenon readily occurs in the maximum point. The designer can optionally determine impurity concentration and its peak position in the lower diffusion region to control the position where breakdown phenomenon occurs. That is, fluctuation factor of Zener voltage can be minimized.

Furthermore, the PN joint surface between the upper diffusion region and the lower diffusion region is formed at a position deeper than the main surface of the semiconductor substrate, making it possible to reduce probability that hot carrier is trapped by a surface defect existing on the main surface when the hot carrier is generated. That is, variation of Zener voltage can be reduced.

In this manner, the semiconductor device makes it possible to suppress property variation during breakdown while minimizing fluctuation factor of Zener voltage.

A method for manufacturing a semiconductor device according to the second aspect of the present disclosure includes: preparing a semiconductor substrate; forming a lower implantation region of a second conductivity type having a higher impurity concentration as compared to the semiconductor substrate so as to have a rotational symmetry shape in a front view of a main surface of the semiconductor substrate by implanting impurity in a surface layer of the main surface; diffusing the lower implantation region by annealing after the forming of the lower implantation region; forming an upper implantation region of a first conductivity type to have a rotational symmetry shape concentric with the lower implantation region at a portion shallower than the lower implantation region with respect to the main surface by implanting impurity in the surface layer of the main surface of the semiconductor substrate after the diffusing of the lower implantation region by annealing; and forming a lower diffusion region by diffusing the lower implantation region and forming an upper diffusion region by diffusing the upper implantation region by annealing after the forming of the upper implantation region.

This makes it possible to form the maximum point at which impurity concentration becomes maximum on a rotational symmetry axis of the lower implantation region, making it possible to suppress fluctuation factor of Zener voltage to the minimum.

A semiconductor device according to the third aspect of the present disclosure includes: a semiconductor substrate of a second conductivity type having a diode formation region; an upper diffusion region of a first conductivity type provided on a surface layer of a main surface of the semiconductor substrate in the diode formation region; a lower diffusion region of a second conductivity type provided at a position deeper than the upper diffusion region with respect to the main surface in a depth direction of the semiconductor substrate, the lower diffusion region having a higher impurity concentration as compared to the semiconductor substrate; and a counter electrode region of the second conductivity type provided on the surface layer of the main surface in the diode formation region, the counter electrode region having a higher impurity concentration as compared to the semiconductor substrate. An inter-electrode region of the second conductivity type having a higher impurity concentration as compared to the semiconductor substrate is provided on the surface layer of the main surface and in a region between the upper diffusion region and the counter electrode region.

This makes it possible to suppress penetration of a depletion layer progressing to the surface layer of the main surface between the upper diffusion region and the counter electrode region during generation of breakdown, making it possible to suppress increase of electrical resistance in current route. This makes it possible to suppress fluctuation of Zener voltage.

Furthermore, a method for manufacturing a semiconductor device according to the fourth aspect of the present disclosure includes: preparing a semiconductor substrate of a second conductivity type; forming a lower implantation region of a second conductivity type having a higher impurity concentration as compared to the semiconductor substrate by implanting impurity in a surface layer of a main surface of the semiconductor substrate; diffusing the lower implantation region by annealing after the forming of the lower implantation region; forming an upper implantation region of a first conductivity type at a position shallower than the lower implantation region with respect to the main surface by implanting impurity in the surface layer of the lower implantation region diffused after the diffusing of the lower implantation region by annealing; forming a lower diffusion region by diffusing the lower implantation region and forming an upper diffusion region by diffusing the upper implantation region by annealing after the forming of the upper implantation region; additionally forming a counter electrode implantation region of the second conductivity type by implanting impurity in the surface layer of the semiconductor substrate and at a position away from the lower implantation region; and forming an inter-electrode region having a higher impurity concentration as compared to the semiconductor substrate in the surface layer of the semiconductor substrate and in a region between the counter electrode implantation region and the lower implantation region.

This makes it possible to suppress penetration of a depletion layer progressing to the surface layer of the main surface between the upper diffusion region and the counter electrode region during generation of breakdown, making it possible to suppress increase of electrical resistance in current route. This makes it possible to suppress fluctuation of Zener voltage.

Hereinafter, embodiments of the present disclosure will be described with reference to the accompanying drawings. Note that the same reference numerals are applied to same or equivalent portions with each other.

First Embodiment

First, a schematic structure of a semiconductor device according to the present embodiment will be described with reference to FIG. 1.

The semiconductor device includes a Zener diode as an element, and is introduced in, for example, a power circuit to function as a constant-voltage power supply.

Figure 1:
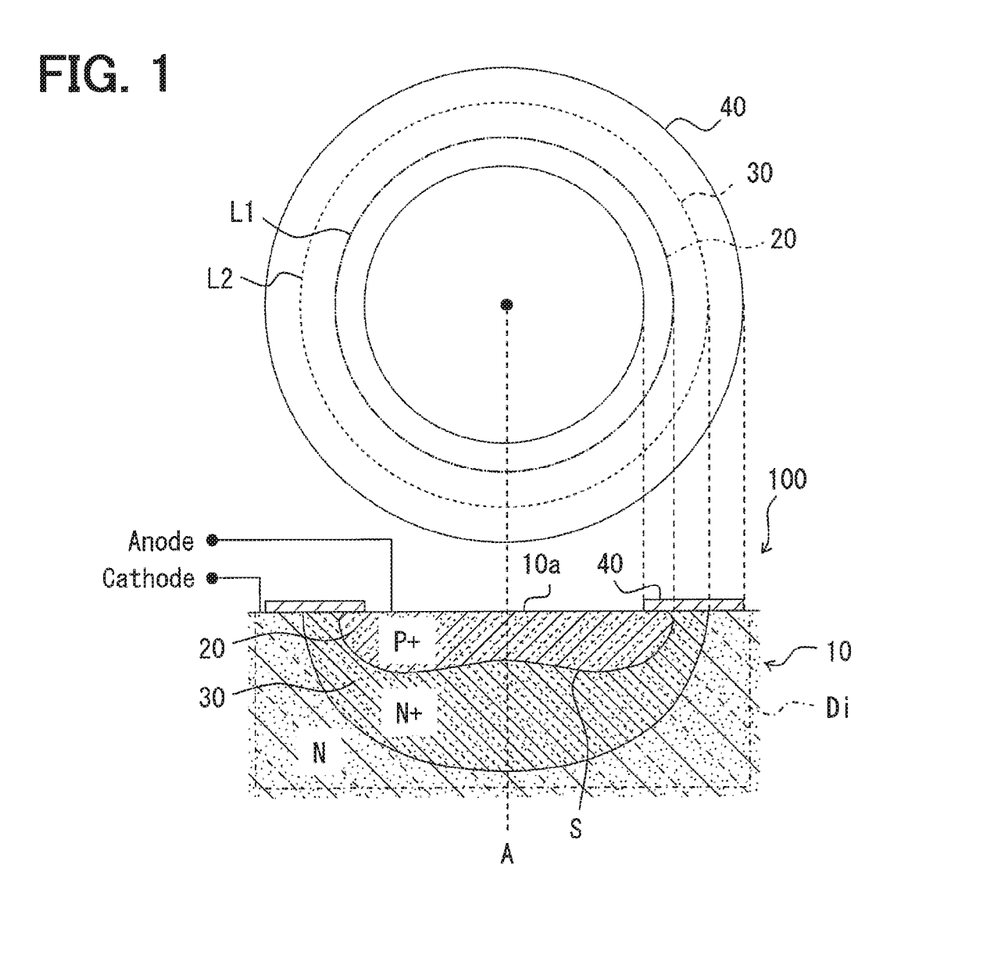
FIG. 1 is a diagram illustrating a cross-section and an upper surface of a semiconductor device according to a first embodiment.

As illustrated in FIG. 1, the semiconductor device 100 includes a semiconductor substrate 10, an upper diffusion region 20, a lower diffusion region 30, and a silicide block layer 40.

The semiconductor substrate 10 is a part of a semiconductor wafer made to be N-conductivity type, and FIG. 1 specifically illustrates a part of the semiconductor substrate 10 on a side of a main surface 10a. The semiconductor substrate 10 has a diode formation region Di. In the diode formation region Di, a PN junction diode is formed as an element by formation of the upper diffusion region 20 and the lower diffusion region 30 described below. The upper diffusion region 20 that is P-conductivity type functions as an anode, and the semiconductor substrate 10 that is N-conductivity type functions as a cathode. N-conductivity type in the present embodiment corresponds to a second conductivity type, and P-conductivity type corresponds to a first conductivity type.

The upper diffusion region 20 is a semiconductor region of P-conductivity type. The upper diffusion region 20 is formed on a surface layer of the semiconductor substrate 10 on a side of the main surface 10a so as to be exposed on the main surface 10a of the semiconductor substrate 10. As illustrated in FIG. 1, the upper diffusion region 20 is formed in rotational symmetry with respect to an axis A perpendicular to the main surface 10a. Specifically, the upper diffusion region 20 in the present embodiment is formed in a nearly perfect circular manner whose center is a point on the axis A when the main surface 10a is viewed from front. A cross-sectional shape of the upper diffusion region 20 passing through the axis A is recessed as it comes close to the axis A as illustrated in FIG. 1. That is, the upper diffusion region 20 is formed in a disc shape recessed in its center. As described below, the axis A in the present embodiment coincides with a symmetry axis. Although the upper diffusion region 20 in the present embodiment is a nearly perfect circle and has a shape like so-called a rotating body when the main surface 10a is viewed from front, it does not necessarily have a rotating body shape. For example, when the main surface 10a is viewed from front, it may be any shape as long as it has an n-fold symmetry shape. Specifically, an elliptical shape, a capsule shape (2-fold symmetry), an equilateral triangle (3-fold symmetry), a square (4-fold symmetry), or the like may be employed.

The lower diffusion region 30 is a semiconductor region of N-conductivity type. The lower diffusion region 30 is formed to cover the upper diffusion region 20. The lower diffusion region 30 is also formed in a rotational symmetry with respect to the axis A like the upper diffusion region 20, and the lower diffusion region 30 in the present embodiment specifically is formed in a nearly perfect circular manner with a point on the axis A as its center when the main surface 10a is viewed from front. The lower diffusion region 30 is also not limited to have a perfect circular shape when the main surface 10a is viewed from front, and any shape may be employed as long as it has an n-fold symmetry shape.

The lower diffusion region 30 is formed adjacently to the upper diffusion region 20, so that a PN joint surface S is formed between the lower diffusion region 30 that is N-conductivity type and the upper diffusion region that is P-conductivity type. As described above, the upper diffusion region 20 has a recessed shape in an opposite surface that is not exposed on the main surface 10a, so that the PN joint surface S has also a similar shape. That is, the PN joint surface S forms a recessed surface shape when the upper diffusion region 20 is supposed to be a main body.

The lower diffusion region 30 in the present embodiment perfectly covers the upper diffusion region 20, and a part of the lower diffusion region 30 is exposed on the main surface 10a. That is, when the main surface 10a is viewed from front, the lower diffusion region 30 is exposed on the main surface 10a in a far region than an outer rim of the upper diffusion region 20 with respect to its formation center. In other words, when the main surface 10a is viewed from front, the upper diffusion region 20, the lower diffusion region 30, and the N-conductivity type semiconductor region of the semiconductor substrate 10 are formed to spread in a concentric manner in this order with the point where the axis A and the main surface 10a cross as their center.

As described above, in the semiconductor device 100, the semiconductor region of P-conductivity type of the upper diffusion region 20, and the semiconductor region of N-conductivity type of the lower diffusion region 30 and the semiconductor substrate 10 form a PN junction to form a diode. The upper diffusion region 20 that is P-conductivity type functions as an anode, and the semiconductor substrate 10 that is N-conductivity type functions as a cathode.

The silicide block layer 40 is an insulating film, and is made of, for example, $SiO_2$ in the present embodiment. The silicide block layer 40 is formed in an annular manner with a point where the axis A and the main surface 10a cross as its center. In the semiconductor device 100 according to the present embodiment, the upper diffusion region 20 and the lower diffusion region 30 are exposed on the main surface 10a, and a semiconductor region of the semiconductor substrate 10 is exposed on the outer side thereof. The silicide block layer 40 is formed to cover a surface from an outer rim of the upper diffusion region 20 to the semiconductor region of the semiconductor substrate 10 via the lower diffusion region 30. That is, the silicide block layer 40 is formed to stride over a PN joint line L1 between the upper diffusion region 20 of P-conductivity type exposed on the main surface 10a and the semiconductor region of N-conductivity type, and a boundary line L2 between the lower diffusion region 30 and the semiconductor substrate 10.

The silicide block layer 40 is formed to keep electrical insulation between the upper diffusion region 20 that is P-conductivity type and the lower diffusion region 30 or the semiconductor substrate 10 that are N-conductivity type when, for example, silicide electrodes including cobalt made contact with an anode and a cathode to function as electrodes are laminated on the main surface 10a for formation.

Next, a manufacturing method of the semiconductor device 100 will be described with reference to FIG. 2 to FIG. 6, and FIG. 1.

Figure 2:
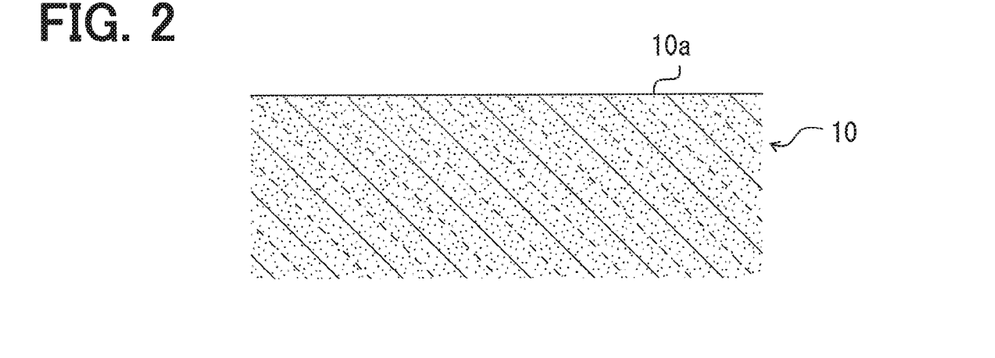
FIG. 2 is a cross-sectional view illustrating a step of preparing a semiconductor substrate.

First, the semiconductor substrate 10 made to be N-conductivity type is prepared as illustrated in FIG. 2.

Figure 3:
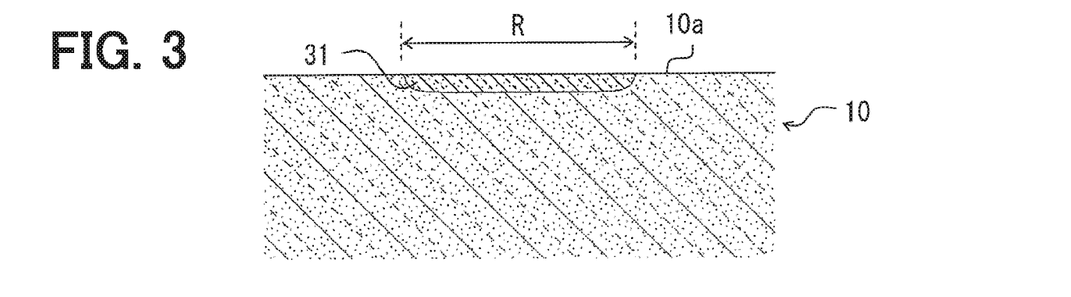
FIG. 3 is a cross-sectional view illustrating a forming step of a lower implantation region.

Then, a photoresist (not shown) hollowed out in a perfect circular manner whose diameter is made to be R is laminated on the main surface 10a, and phosphorus or arsenic is ion-implanted. Ion implantation is performed with the same energy across one surface 10a to make implantation depth substantially constant. This forms a lower implantation region 31 of N-conductivity type whose diameter is made to be R as illustrated in FIG. 3. That is, an N-conductivity region having a disc shape with the axis A as a rotational symmetry axis is formed. The lower implantation region 31 is a region before being diffused by annealing, and becomes the lower diffusion region 30 after the following two annealing steps.

Figure 4:
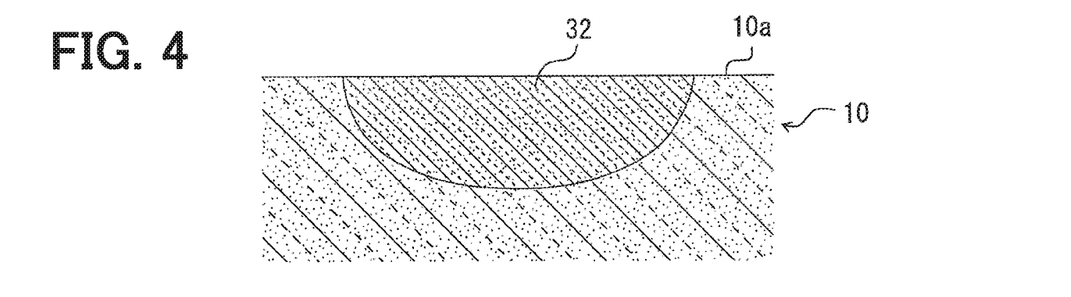
FIG. 4 is a cross-sectional view illustrating a first annealing step.

After formation of the lower implantation region 31, the photoresist not shown is removed and a first annealing step is performed. This annealing step diffuses impurity forming the lower implantation region 31 in the semiconductor substrate 10 as illustrated in FIG. 4. In the first annealing step, an impurity region 32 formed by thermal diffusion of the lower implantation region 31 is not diffused to the extent of the lower diffusion region 30 illustrated in FIG. 1.

Figure 5:
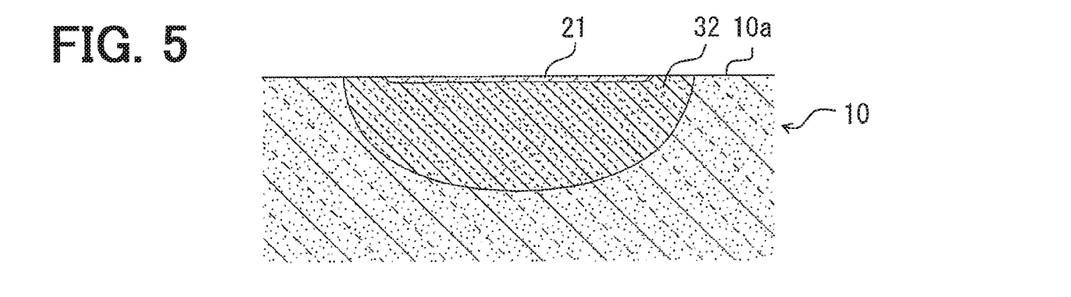
FIG. 5 is a cross-sectional view illustrating a forming step of an upper implantation region.

After the first annealing step, a photoresist (not shown) having the center same as that of the lower implantation region 31 and hollowed out in a perfect circular manner whose diameter is smaller than the impurity region 32 illustrated in FIG. 4 is laminated on the main surface 10a, and boron is ion-implanted. Ion implantation is performed with the same energy across one surface 10a to make implantation depth substantially constant. This forms an upper implantation region 21 of P-conductivity type surrounded by the impurity region 32 as illustrated in FIG. 5. That is, a P-conductivity type region having a disc shape with the axis A as its rotational symmetry axis is formed. The upper implantation region 21 is a region before being diffused by annealing and becomes the upper diffusion region 20 after the second annealing step described below.

Figure 6:
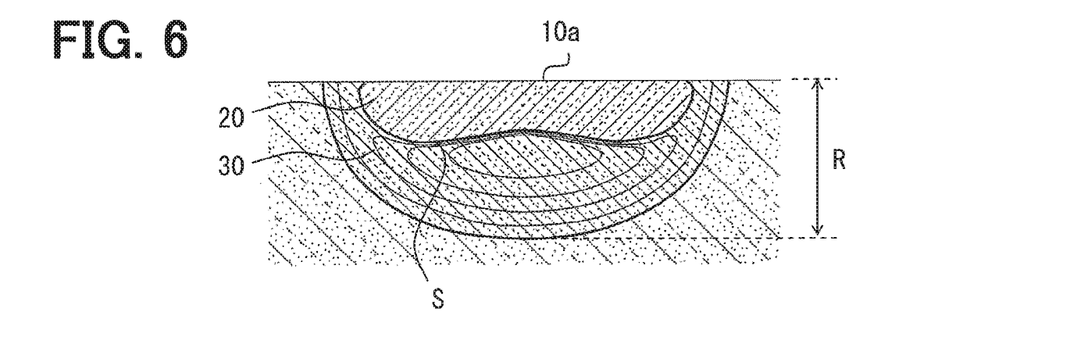
FIG. 6 is a cross-sectional view illustrating a second annealing step.

After forming the upper implantation region 21, the photoresist not shown is removed, and a second annealing step is performed. By the second annealing step, the upper implantation region 21 is thermally diffused as illustrated in FIG. 6, and the impurity region 32 formed by diffusion of the lower implantation region 31 to some extent is further thermally diffused. The upper implantation region 21 subjected to the second annealing step diffuses to a region corresponding to the upper diffusion region 20, and the lower implantation region 31 diffuses to a region corresponding to the lower diffusion region 30.

Formation depth of the lower diffusion region 30 after thermal diffusion is preferably designed so as to be substantially equal to a diameter R of ion implantation of the lower implantation region 31. Parameters for annealing temperature, energy for ion implantation, and impurity concentration can be determined by commonization of process with another element formed in the semiconductor substrate 10, so that there is a case in which the values are difficult to be changed. Accordingly, designing the formation depth of the lower diffusion region 30 so as to be substantially equal to the diameter R of ion implantation of the lower implantation region 31 means making a formation radius of the lower implantation region 31 coincide with an assumed formation depth of the lower diffusion region 30.

Incidentally, before the second annealing step, impurity concentration of the impurity region 32 due to the lower implantation region 31 has a peak at a position on the axis A and deeper than the upper implantation region 21. Accordingly, when the upper implantation region 21 thermally diffuses through the second annealing step, a portion near the center of the upper implantation region 21 having a disc shape is difficult to be inverted in its conductivity type. This makes the cross-sectional shape of the upper diffusion region 20 passing through the axis A as illustrated in FIG. 6 after the second annealing step has a recessed structure as it comes close to the axis A as illustrated in FIG. 1. That is, the upper diffusion region 20 is formed in a disc shape whose center is recessed. That is, the PN joint surface S between the upper diffusion region 20 and the lower diffusion region 30 forms a recessed surface shape when the upper diffusion region 20 is supposed to be a main body.

Note that, contours illustrated in the lower diffusion region 30 in FIG. 6 illustrate contours of impurity concentration, and illustrate that a peak of impurity concentration in the lower diffusion region 30 is positioned at a lower portion of the recess in the upper diffusion region 20.

After the second annealing step, as illustrated in FIG. 1, the silicide block layer 40 is formed to stride over the PN joint line L1 between the upper diffusion region 20 of P-conductivity type exposed on the main surface 10*a* and the semiconductor region of N-conductivity type and the boundary line L2 between the lower diffusion region 30 and the semiconductor substrate 10.

The manufacturing method including the above-mentioned steps can produce the semiconductor device 100.

Next, operation and effect of the semiconductor device 100 and the manufacturing method thereof in the present embodiment will be described.

Figure 7:
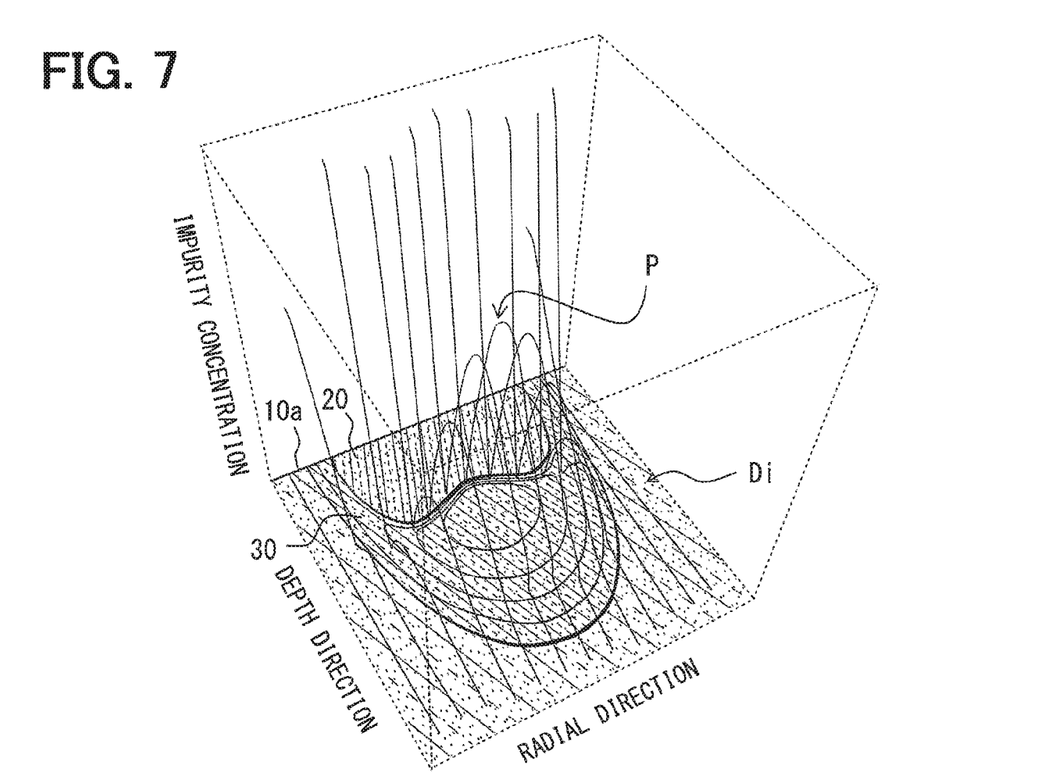
FIG. 7 is a diagram illustrating a 3-dimensional profile of impurity concentration.

In the semiconductor device 100 illustrated in FIG. 1 and FIG. 6, the upper diffusion region 20 and the lower diffusion region 30 are formed to be substantially rotational symmetry with respect to the axis A, so that their impurity profiles are also become substantially rotational symmetry with respect to the axis A. The inventors of the present invention have simulated specific impurity profiles using a computer. FIG. 7 shows results of the simulation.

As illustrated in FIG. 7, the lower diffusion region 30 formed in the diode formation region Di has the maximum point P where impurity concentration becomes maximum. In the present embodiment, specifically only one maximum point P is present in the lower diffusion region 30. The maximum point P in the present embodiment is located on the axis A and at a lower portion of the PN joint surface S.

Generally, when a reverse bias is applied to a PN joint Zener diode, electric field becomes large between portions where impurity concentration is high, of each of a region of N-conductivity type and a region of P-conductivity type, readily causing breakdown phenomenon. In the semiconductor device 100 according to the present embodiment, a portion where impurity concentration is high of the lower diffusion region 30 indicating N-conductivity is not distributed in a 3-dimensional manner like a traditional manner, and is regulated as a 0-dimension (point), making it possible to specify a portion where breakdown phenomenon occurs as a point. That is, the semiconductor device 100 enables generation position of breakdown phenomenon to be fixed at a nearly predetermined position (maximum point P).

Figure 8:
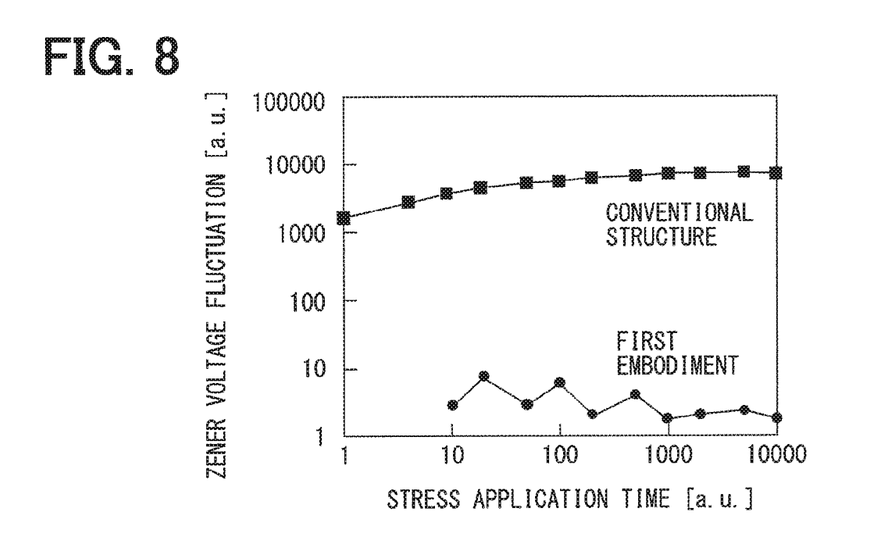
FIG. 8 is a diagram illustrating temporal change of variation of Zener voltage.

A reason for increasing temporal variation of Zener voltage provably is in that generation source of breakdown phenomenon is 3-dimensionally distributed to make generation of breakdown phenomenon inconstant, but the semiconductor device 100 of the present embodiment enables generation position of breakdown phenomenon to be set as a point. This enables to limit generation position of breakdown phenomenon as compared with a conventional structure where breakdown phenomenon occurs in a 3-dimensional manner, making it possible to suppress temporal variation of Zener voltage as compared with the conventional structure as illustrated in FIG. 8. For example, employing a Zener diode included in the semiconductor device 100 as a constant voltage power source makes it possible to control output voltage with high accuracy independent from passage of time.

Also, the semiconductor device 100 according to the present embodiment has a recessed surface structure recessed in the PN joint surface S when the upper diffusion region 20 is supposed to be a main body. Specifically, the semiconductor device 100 has a structure recessed near the axis A. This makes it possible to readily make an impurity distribution be formed in which a lower portion of a recessed portion of the upper diffusion region 20 in the lower diffusion region 30 has a peak as illustrated in FIG. 7. In other words, the maximum of impurity concentration can be readily formed in a point-like manner.

Furthermore, in the semiconductor device 100 according to the present embodiment, the upper diffusion region 20 and the lower diffusion region 30 have a rotational symmetry shape, and specifically have a perfect circular shape when the one surface 10*a* is viewed from front. This makes it possible to make the maximum of impurity concentration in the lower diffusion region 30 be on the rotational symmetry axis (axis A in the present embodiment), making it possible to readily form the maximum of impurity concentration in a point-like manner.

Furthermore, in the semiconductor device 100 according to the present embodiment, a formation diameter R of the lower implantation region 31 that is a precursor region of the lower diffusion region 30 is made substantially equal to an assumed formation depth of the lower diffusion region 30 in the manufacturing step of the semiconductor device 100. This makes it possible to readily form the maximum of impurity concentration in the lower diffusion region 30 in a point-like manner. For example, when the formation diameter R of the lower implantation region 31 is larger than the assumed formation depth of the lower diffusion region 30, the maximum portion of impurity concentration is likely to be distributed in 1-dimensional manner or 2-dimensional manner extending in a direction along the main surface 10a. Alternatively, when the formation diameter R of the lower implantation region 31 is smaller than the assumed formation depth of the lower diffusion region 30, the maximum portion of impurity concentration is likely to be distributed in 1-dimensional manner or 2-dimensional manner extending in the depth direction of the semiconductor substrate 10. In contrast, when the formation diameter R of the lower implantation region 31 is made substantially equal to the assumed formation depth of the lower diffusion region 30, the maximum of impurity concentration in the lower diffusion region 30 can be readily formed in a point-like manner.

For the semiconductor device 100 according to the present embodiment, impurity is ion-implanted to an even depth in its manufacturing step, specifically in formation of the upper implantation region 21. This makes conductivity type be readily inverted at a portion where impurity concentration is small in the impurity region 32 that is a precursor region of the lower diffusion region 30 in the second annealing step, making it possible to readily form a recessed surface structure of the PN joint surface S. That is, as described above, the maximum of impurity concentration of the lower diffusion region 30 can be readily formed in a point-like manner.

Furthermore, the semiconductor device 100 according to the present embodiment is formed such that the lower diffusion region 30 covers the upper diffusion region 20 and is exposed on the main surface 10a. This enables spread of a depletion layer formed between the upper diffusion region 20 of P-conductivity type and the region of N-conductivity type in a direction along the main surface 10a to be suppressed as compared with a structure where the lower diffusion region 30 is not exposed on the main surface, in a surface layer of the main surface 10a. This makes it possible to suppress trapping of hot carrier in a level due to surface defect existing near the main surface 10a, making it possible to suppress temporal variation of Zener voltage.

Incidentally, the semiconductor device 100 according to the present embodiment includes the silicide block layer 40 on the main surface 10a. This makes it possible to prevent occurrence of electrical conduction due to silicide between the upper diffusion region 20 that is P-conductivity type and the lower diffusion region 30 or the semiconductor substrate 10 that is N-conductivity type when a silicide electrode is laminated on the main surface 10a for formation. To this end, the silicide block layer 40 should be formed to stride over the PN joint line L1 between the upper diffusion region 20 and the lower diffusion region 30 as well as stride over the boundary line L2 between the lower diffusion region 30 and the semiconductor region in the semiconductor substrate 10 when the lower diffusion region 30 is exposed on the main surface 10a. Also, when the lower diffusion region 30 is not exposed on the main surface 10a, the silicide block layer 40 should be formed to stride over a boundary line between the upper diffusion region 20 and the semiconductor region in the semiconductor substrate 10.

Second Embodiment

In the first embodiment, an example is illustrated in which the PN joint surface S between the upper diffusion region 20 and the lower diffusion region 30 is a recessed surface when the upper diffusion region 20 is supposed to be a main body, but the PN joint surface S may be a projected surface.

Figure 9:
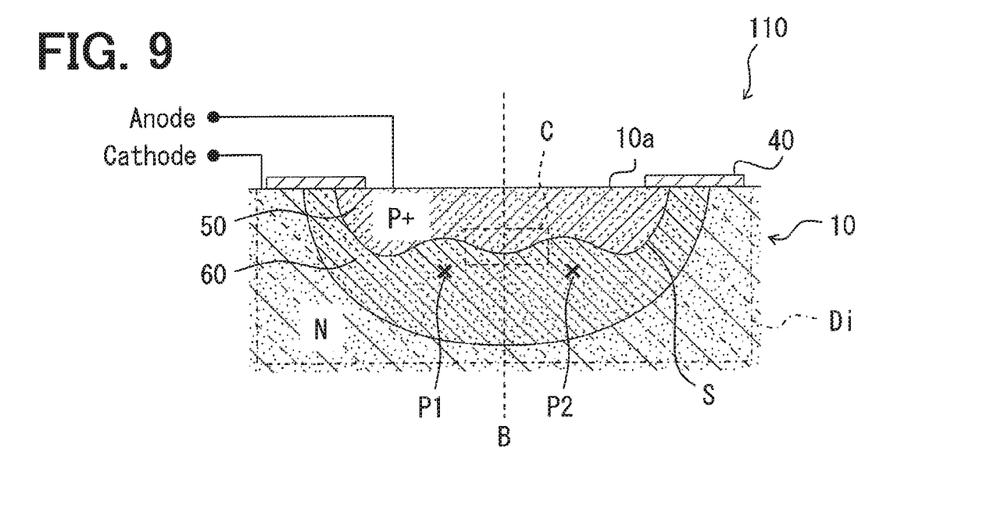
FIG. 9 is a cross-sectional view of a semiconductor device according to a second embodiment.

A semiconductor device 110 according to the present embodiment includes an upper diffusion region 50 and a lower diffusion region 60 having a shape different from those in the first embodiment as illustrated in FIG. 9. The semiconductor device 110 has a projected surface portion C that becomes a projected surface in a cross-section of the PN joint surface S. Also in the semiconductor device 110, the upper diffusion region 50 and the lower diffusion region 60 have a perfect circular shape when viewed from front of the main surface 10a, and are rotating bodies with an axis B passing through the center of the perfect circle and perpendicular to the main surface 10a as their symmetry axis. The recessed surface portion C has a tip of the projected surface on the axis B.

In the present embodiment, impurity concentration of the lower diffusion region 60 has peaks near respective lower portions of recessed portions formed outside the projected surface portion C of the PN joint surface S. That is, in the cross-section illustrated in FIG. 9, impurity concentration has the maximum points illustrated by a point P1 and a point P2. Actually, the upper diffusion region 50 and the lower diffusion region 60 have a disc shape, so that the maximum pints P1 and P2 are also parts of a circle with the axis B as a symmetry axis. That is, the maximum points of impurity concentration in the lower diffusion region 60 according to the present embodiment are distributed by plural in a 1-dimensional manner around the axis B (specifically, in a circular manner).

In this manner, making the PN joint surface S be a projected surface shape makes it possible to distribute the maximum points of impurity concentration of the lower diffusion region 60 in a 1-dimensional manner. Like the first embodiment, the maximum point of impurity concentration is dominant as a generation position of breakdown phenomenon, so that generation position of breakdown phenomenon can be determined as a line in the semiconductor device 110. This can limit generation position of breakdown phenomenon as compared with a conventional structure where breakdown phenomenon occurs in a 3-dimensional manner, making it possible to suppress temporal fluctuation of Zener voltage. For example, employing a Zener diode included in the semiconductor device 110 as a constant voltage power source makes it possible to control output voltage with high accuracy independent from passage of time.

Hereinafter, a manufacturing method of the semiconductor device 110 will be simply described.

First, like the first embodiment, the semiconductor substrate 10 is prepared as illustrated in FIG. 2.

Figure 10:
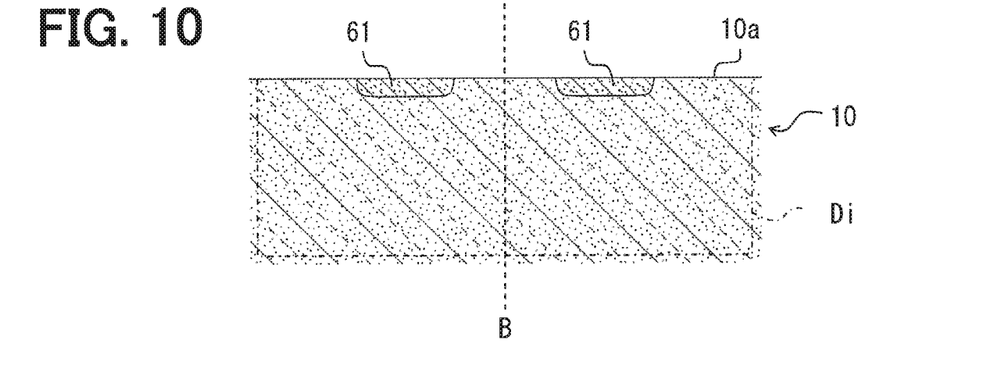
FIG. 10 is a cross-sectional view illustrating a forming step of a lower implantation region.

Then, as illustrated in FIG. 10, phosphorus or arsenic is ion-implanted to form a lower implantation region 61. The lower implantation region 61 is formed in a rotational symmetry shape with the axis B as a symmetry axis. Specifically, in the present embodiment, the lower implantation region 61 is formed in an annular manner. Although the lower implantation region 31 in the first embodiment is a perfect circle when viewed from the front of the main surface 10a, the lower implantation region 61 in the present embodiment has an annular shape hollowed out near its center. Note that in FIG. 10, although two lower implantation regions 61 are separated because of cross-sectional view, they are continuous in a front and back direction of the paper in reality. The lower implantation region 61 becomes a region of the lower diffusion region 60 by thermal diffusion of two times by post steps.

Figure 11:
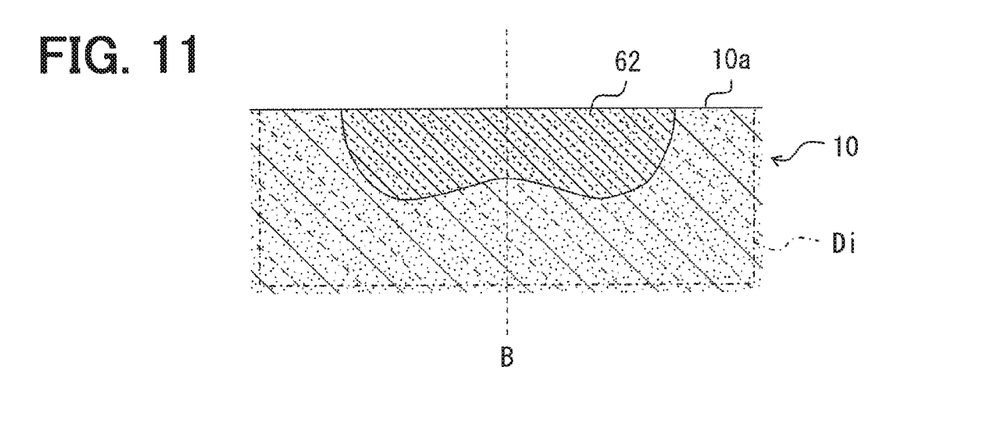
FIG. 11 is a cross-sectional view illustrating a first annealing step.

Then, first annealing step is performed. This makes the lower implantation region 61 thermally diffuse to form an impurity region 62 of N-conductivity type as illustrated in FIG. 11. Since the lower implantation region 61 before the annealing step has an annular shape, concentration structure of impurity in the impurity region 62 after thermal diffusion has nearly a torus structure in which higher concentration portions are distributed in a circular manner with the axis B as a symmetry axis.

Figure 12:
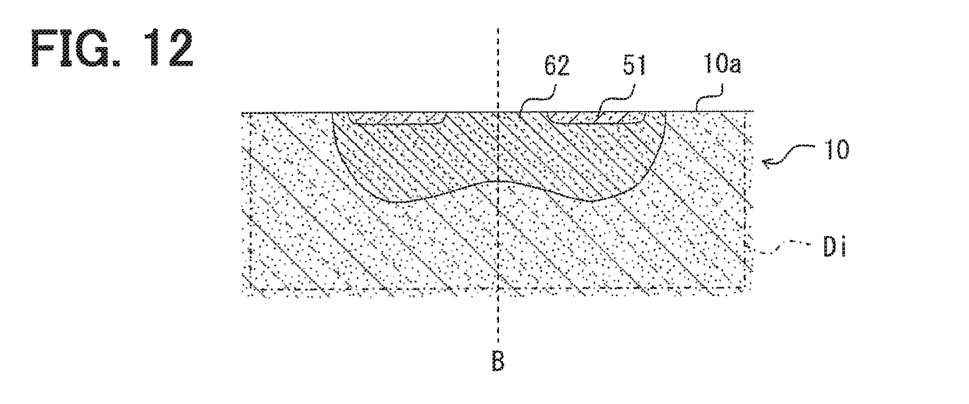
FIG. 12 is a cross-sectional view illustrating a forming step pf an upper implantation region.

Next, as illustrated in FIG. 12, boron is ion-implanted to form an upper implantation region 51. The upper implantation region 51 is formed to be included in the impurity region 62. Specifically, the upper implantation region 51 is formed at an upper portion of a portion where concentration becomes a peak in the impurity region 61 that is a precursor region of the lower diffusion region 60. That is, the upper implantation region 51 is formed in a rotational symmetry shape with the axis B as a symmetry axis. Specifically, in the present embodiment, the upper implantation region 51 is formed in an annular manner. Although the upper implantation region 21 in the first embodiment is a perfect circle when viewed from the front of the main surface 10a, the upper implantation region 51 in the present embodiment has an annular shape hollowed out near its center. In FIG. 12, the two upper implantation regions 51 are separated because of cross-sectional view, but they are continuous in a front and back direction of the paper in reality. The upper implantation region 51 becomes a region of the upper diffusion region 50 by two times thermal diffusion by post steps.

Then, a second annealing step is performed. By the second annealing step, the upper implantation region 51 thermally diffuses, and impurity region 62 formed by diffusion of the lower implantation region 61 to some extent further thermally diffuses as illustrated in FIG. 9. The upper implantation region 51 subjected to the second annealing step diffuses to a region corresponding to the upper diffusion region 50, and the lower implantation region 61 diffuses to a region corresponding to the lower diffusion region 60.

In this context, a torus shape of the impurity concentration distribution of the impurity region 62 that is a precursor region of the lower diffusion region 60 is almost kept, and the maximum of the impurity concentration of the lower diffusion region 60 is formed in a circular shape as illustrated above. The silicide block layer 40 is formed to stride over the PN joint line between the upper diffusion region 50 of P-conductivity type and the semiconductor region of N-conductivity type, and the boundary line between the lower diffusion region 60 and the semiconductor substrate 10, which are exposed on the main surface 10a.

The semiconductor device 110 in which the PN joint surface S becomes a projected surface can be produced as described above.

Third Embodiment

In the structure having the lower diffusion region 30, 60 as exemplified in the first embodiment and the second embodiment, a depletion layer generated when breakdown occurs may extend to a wide region outside the lower diffusion region 30, 60 in a surface layer of the semiconductor substrate 10. This is probably caused by surface trap in the surface layer of the semiconductor device 10, and causes increase in electrical resistance of current path between the upper diffusion region 20, 50 as an anode and a cathode. The increase in electrical resistance can disadvantageously cause a temporal fluctuation of zener voltage.

Figure 13:
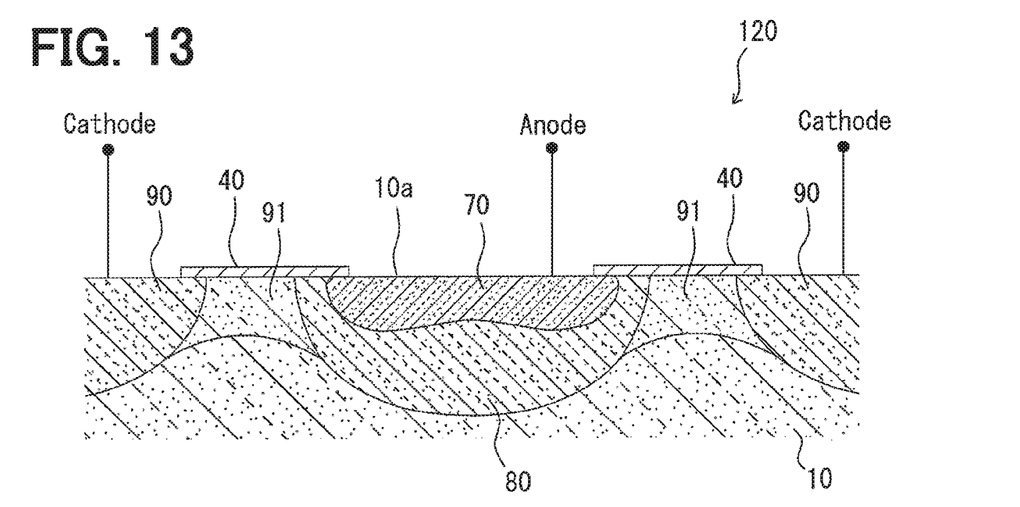
FIG. 13 is a cross-sectional view of a semiconductor device according to a third embodiment.

Therefore, a semiconductor device 120 according to the present embodiment includes, in addition to an upper diffusion region 70 and a lower diffusion region 80, a cathode region 90 in which impurity concentration is set higher than that in the semiconductor substrate 10 and an inter-electrode region 91 formed between the upper diffusion region 70 that functions as an anode and the cathode region 90 in the diode formation region Di as illustrated in FIG. 13. The cathode region 90 corresponds to a counter electrode region.

The upper diffusion region 70 and the lower diffusion region 80 in the present embodiment are respectively formed like the upper diffusion region 20 and the lower diffusion region 30 in the first embodiment. That is, the upper diffusion region 70 is a semiconductor region of P-conductivity type formed exposed on the main surface 10a, and the lower diffusion region 80 is a semiconductor region of N-conductivity type formed to cover the upper diffusion region 70 in the semiconductor substrate 10. Although their detailed structures are omitted because they are described in the first embodiment, the PN joint surface S between the upper diffusion region 70 and the lower diffusion region 80 has a recessed surface shape and structurally controlled such that breakpoint is almost formed as a point (0 dimensions) also in the present embodiment.

The cathode region 90 that is a counter electrode region is a semiconductor region of N-conductivity type higher than the semiconductor substrate 10 in concentration, and when the main surface 10a is viewed from front, the cathode region 90 is a region having an annular shape concentric with the upper diffusion region 70. The cathode region 90 is exposed on the main surface 10a, and a cathode electrode is joined in an ohmic manner at the exposed surface. In the present embodiment, the cathode region 90 and the lower diffusion region 80 are formed in the same step, so that their averaged impurity concentrations are substantially equal.

The inter-electrode region 91 is a semiconductor region of N-conductivity type formed between the upper diffusion region 70 and the cathode region 90. The inter-electrode region 91 has impurity concentration higher than impurity concentration of the semiconductor substrate 10. The inter-electrode region 91 is formed to be exposed on the main surface 10a, and this makes a region of N-conductivity type forming the semiconductor substrate 10 be not exposed on the main surface 10a in a region surrounded by the cathode regions 90. In other words, in the main surface 10a, distribution of impurity in a radial direction viewed from the center of the upper diffusion region 70 is spread in a concentric manner from P-conductivity type of the upper diffusion region 70, N-conductivity type of the lower diffusion region 80 exposed on the main surface 10a, N-conductivity type of the inter-electrode region 91, and N-conductivity type of the cathode region 90 in this order.

In the semiconductor device 120 of the present embodiment, the inter-electrode region 91 is formed in a step different from a step of forming the lower diffusion region 80 and the cathode region 90. The impurity concentration of the inter-electrode region 91 can be controlled independently from the lower diffusion region 80 and the cathode region 90, and determined on the basis of intention by the designer. The impurity concentration in the inter-electrode region 91 needs to be lower than concentration in the cathode region 90 to which a cathode electrode is connected, and is preferably higher than concentration in the semiconductor substrate 10 and lower than the maximum value of impurity concentration in the lower diffusion region 80. The place where impurity concentration in the lower diffusion region 80 in the present embodiment becomes maximum is the maximum point of impurity concentration, and is formed as almost a point (0-dimension), which becomes a breakpoint. The impurity concentration in the inter-electrode region 91 is made lower than that at the breakpoint. This prevents breakdown near the inter-electrode region 91. In other words, breakdown is to be generated intentionally in the lower diffusion region 80.

Figure 15:
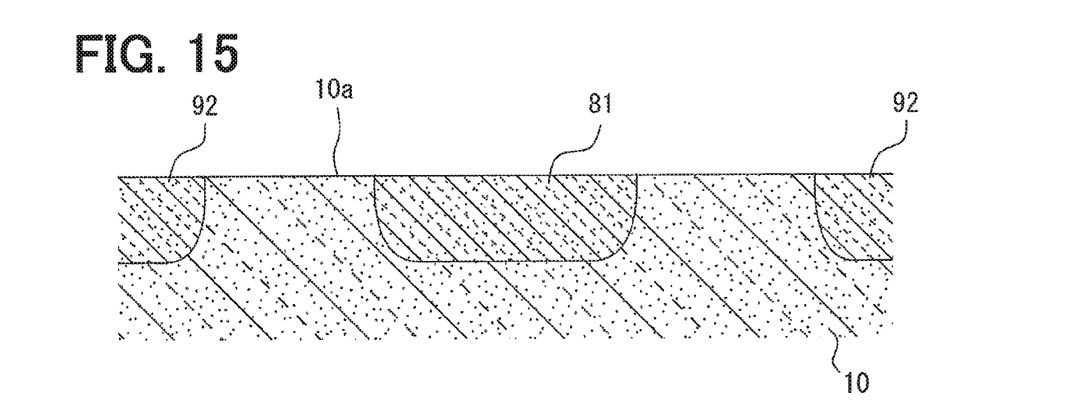
FIG. 15 is a cross-sectional view illustrating a first annealing step.
Figure 16:
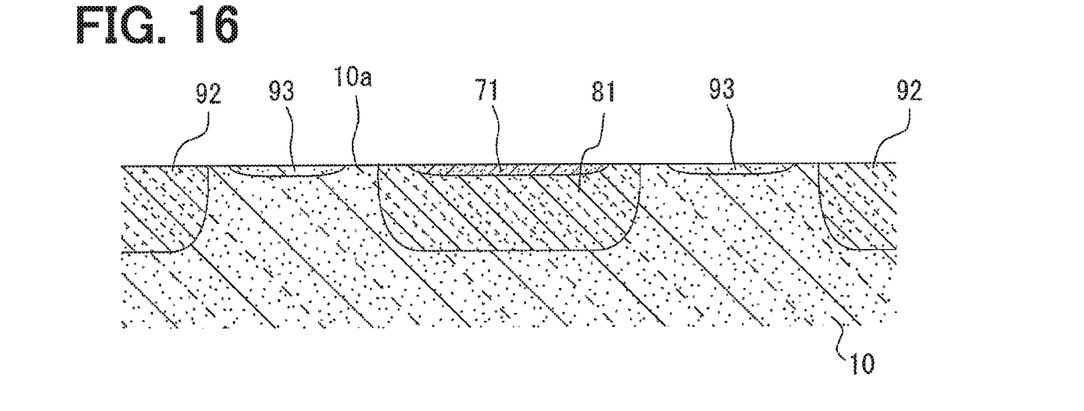
FIG. 16 is a cross-sectional view illustrating a forming step of an upper implantation region and an inter-electrode implantation region.

A manufacturing method of the semiconductor device 120 will be described with reference to FIG. 14 to FIG. 16 while quoting the description related to the manufacturing method of the semiconductor device 100 according to the first embodiment.

First, the semiconductor substrate 10 of N-conductivity type is prepared.

Figure 14:
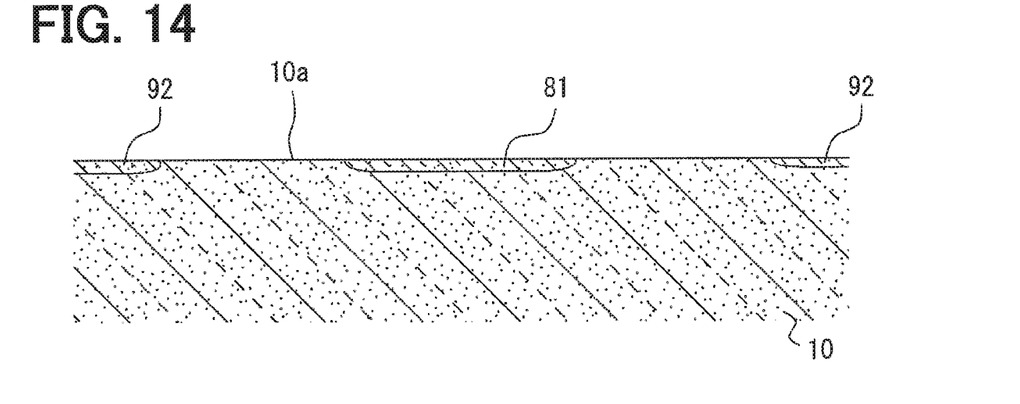
FIG. 14 is a cross-sectional view illustrating a forming step of a lower implantation region and a counter electrode implantation region.

Then, as illustrated in FIG. 14, like the first embodiment, a lower implantation region 81 is formed by ion implantation. In this context, a counter electrode implantation region 92 is formed in a step same as or different from the step of forming the lower implantation region 81. Both the lower implantation region 81 and the counter electrode implantation region 92 are formed on a surface layer of the main surface 10a. The regions respectively become the lower diffusion region 80 and the cathode region 90 by the annealing step described below.

Then, these regions are subjected to the annealing step for thermally diffusing impurity. As illustrated in FIG. 15, by the annealing step, the lower implantation region 81 and the counter electrode implantation region 92 form a semiconductor region higher than the semiconductor substrate 10 in their concentration while diffusing impurity in the semiconductor substrate 10.

Then, ion is implanted in a region where the lower implantation region 81 is thermally diffused by the annealing step to form the upper implantation region 71 of P-conductivity type. Furthermore, ion is implanted on a surface layer of the main surface 10a surrounded by the lower implantation region 81 and the counter electrode implantation region 92 to form an inter-electrode implantation region 93 of N-conductivity type.

Then, after subjecting thereto the annealing step again, impurity in each semiconductor region is thermally diffused. This makes impurity be distributed as illustrate in FIG. 13. Then, the silicide block layer 40 is formed in an annular manner to produce the semiconductor device 120. The silicide block layer 40 is located such that its inner rim of circular ring is on the upper diffusion region 70 and its outer rim of circular ring is on the cathode region 90. That is, an exposed portion of the lower diffusion region 80 and the inter-electrode region 91 on the main surface 10a are perfectly hidden by the silicide block layer 40.

Operation and effect obtained by employing the semiconductor device 120 according to the present embodiment will be described.

As described above, a depletion layer generated when breakdown occurs may reach a wide region outside the lower diffusion region 30, 60 in a surface layer of the semiconductor substrate 10, and this is probably caused by surface trap in the surface layer of the semiconductor device 10. The semiconductor device 120 has the cathode region 90, and the inter-electrode region 91 having a higher concentration than that in the semiconductor substrate 10 so that an impurity layer of N-conductivity type forming the semiconductor substrate 10 is not exposed on the semiconductor substrate 10a. This can make a situation where a depletion layer extending from the upper diffusion region 70 is difficult to penetrate in the inter-electrode region 91. This can suppress increase of electrical resistance between the upper diffusion region 70 and the cathode region 90. This can suppress temporal fluctuation of Zener voltage.

Fourth Embodiment

In the third embodiment, although an example is described of forming the inter-electrode implantation region 93 as a step different from ion implantation according to formation of the lower diffusion region 80 and the cathode region 90 when the inter-electrode region 91 is formed, the step of forming the inter-electrode implantation region 93 can be omitted by making the formation positions of the lower diffusion region 80 and the cathode region 90 come close.

Figure 17:
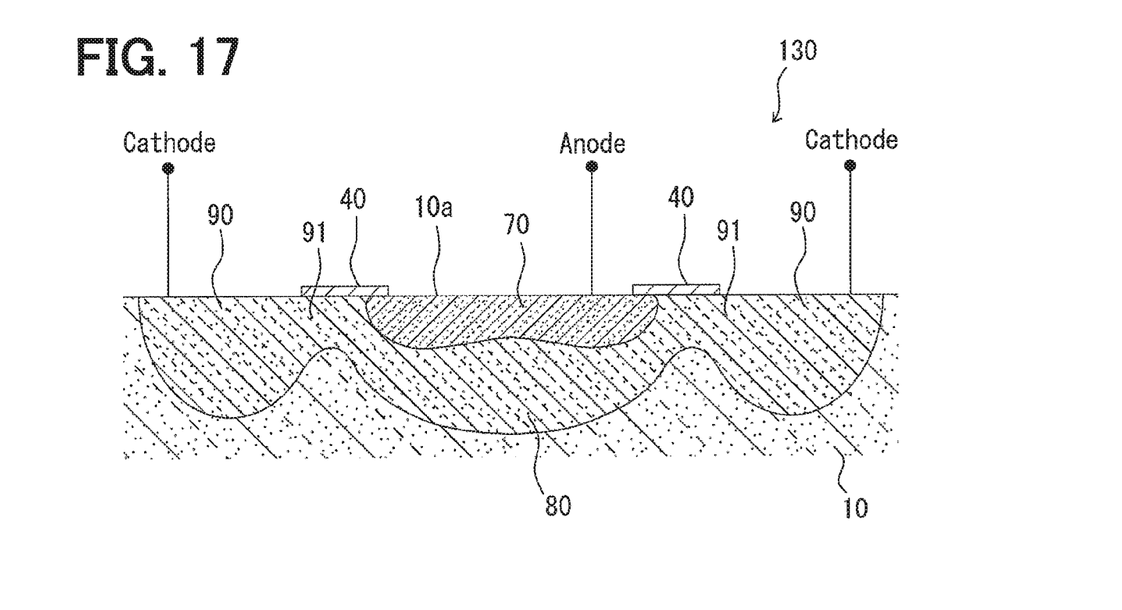
FIG. 17 is a cross-sectional view of a semiconductor device according to a fourth embodiment.

As illustrated in FIG. 17, in a semiconductor device 130 according to the present embodiment, the inter-electrode region 91 is formed as a portion where the lower diffusion region 80 and the cathode region 90 as a counter electrode region are overlapped. The inter-electrode region 91 is N-conductivity type and has higher concentration than impurity concentration forming the semiconductor substrate 10 like the third embodiment.

To provide such a mode, the lower implantation region 81 and the counter electrode implantation region 92, for example, described with reference to FIG. 14 in the third embodiment are laid out such that their clearance becomes short in forming them. This makes the regions from which impurity thermally diffuses be overlapped with each other by the annealing step after ion implantation, resulting in formation of the inter-electrode region 91. Employing the mode and the method can eliminate the ion implantation step to form the inter-electrode implantation region 93 as well as make a situation where a depletion layer extending from the upper diffusion region 70 is difficult to penetrate in the inter-electrode region 91.

Other Embodiments

The present disclosure has been described in compliance with the embodiments, but the present disclosure is understood as not being limited to the embodiments and structures. The present disclosure also encompasses various modifications and modifications within equivalent range. Additionally, various combinations and modes, and in addition, other combinations and modes of only one component, more, or less thereof are intended to fall within the scope and ideological scope of the present disclosure.

In each of the above-mentioned embodiments, although examples are illustrated in which the upper diffusion region 20, 50, 70 and the upper implantation region 21, 51, 71 are formed in a perfect circular shape with the axis A or the axis B as their symmetry axis, the shapes of the upper diffusion region 20, 50, 70 and the upper implantation region 21, 51, 71 viewed from front of the main surface 10a are not limited to a perfect circle, and any shape may be employed as long as they have an n-fold symmetry shape. Specifically, an elliptical or capsule shape (2-fold symmetry), a regular equilateral triangle (3-fold symmetry), a square (4-fold symmetry) a regular pentagon (5-fold symmetry), a regular hexagon (6-fold symmetry), or the like may be employed.

Likewise, although examples are illustrated in which the lower diffusion region 30, 60, 80, and the lower implantation region 31, 61, 81 are formed in a perfect circular shape with the axis A or the axis B as their symmetry axis, the shapes of the lower diffusion region 30, 60, 80 and the lower implantation region 31, 61, 81 viewed from front of the main surface 10a are not limited to a perfect circle, and any shape may be employed as long as they have an n-fold symmetry shape. In a case of a two-fold symmetry shape, the maximum of impurity concentration becomes not a point but linear (1-dimension) along a long side.

In addition, the upper diffusion region 20, 50, 70 and the corresponding lower diffusion region 30, 60, 80 preferably have similar shapes with each other when they are viewed from front of the main surface 10a. Symmetric property between the upper diffusion region 20, 50, 70 and the corresponding lower diffusion region 30, 60, 80 can readily form a breaking point in 1-dimension or 0-dimension lower than 3-dimension in the lower diffusion region 30, 60, 80.

Furthermore, in each of the above-mentioned embodiments, an example is described in which the silicide block layer 40 is formed concentric with the upper diffusion region 20, 50, 70 and the lower diffusion region 30, 60, 80, but this is not a limitation, and their formation centers may be displaced. There is a case in that no silicide block layer 40 is needed when no electrode using silicide is formed, and the silicide block layer 40 is not a necessary element in such a mode.

In each of the above-mentioned embodiments, P-conductivity type is employed for the upper diffusion region 20, 50, and N-conductivity type is employed for the lower diffusion region 30, 60, but these conductivity types may be reversed each other. Examples are described in which an N-conductivity type substrate is employed for the semiconductor substrate, but any of N-conductivity type and P-conductivity type may be employed for the semiconductor substrate independently from the conductivity type of the upper diffusion region 20, 50 and the lower diffusion regions 30, 60. However, when the inter-electrode region 91 exists, the counter electrode region corresponding to the cathode region 90, the lower diffusion region 30, 60, 80, and the semiconductor substrate 10 need to be the same conductivity type.

In each of the above-mentioned embodiments, the mode is exemplified in which the lower diffusion region 30, 60, 80 perfectly covers the corresponding upper diffusion region 20, 50, 70 in the semiconductor substrate 10 to be exposed on the main surface 10a, but a structure may be employed in which the lower diffusion region is located only at a lower portion of the upper diffusion region so as not to be exposed on the main surface 10a. However, the structure in which the lower diffusion region perfectly covers the upper diffusion region to be exposed on the main surface 10a can suppress a spread of a depletion layer formed between the upper diffusion region 20, 50, 70 of P-conductivity type and the region of N-conductivity type in a direction along the main surface 10a in a surface layer of the main surface 10a as compared with the structure in which the lower diffusion region 30, 60, 80 is not exposed on the main surface. This makes it possible to suppress trapping of hot carrier in a level due to surface defect existing near the main surface 10a, making it possible to suppress temporal variation of zener voltage. In this regard, it is further advantageous to have the inter-electrode region 91.

In each of the above-mentioned embodiments, description is made focusing on the diode formation region Di in which a Zener diode is formed in the semiconductor substrate 10, but this does not prevent formation of another element in a region excluding the diode formation region in the semiconductor substrate 10. For example, a MOSFET or an IGBT may be additionally formed in the same semiconductor substrate 10.

In the third embodiment and the fourth embodiment, the structure is described in which the joint surface between the upper diffusion region 20, 50, 70 and the lower diffusion region 30, 60, 80 has a recessed surface shape and the maximum point indicating the maximum of concentration is formed in the impurity concentration profile of the lower diffusion region 30, 60, 80. Formation of the inter-electrode region 91 can provide an advantageous effect of suppressing temporal fluctuation of zener voltage with respect to a conventional mode in which the joint surface between the upper diffusion region 20, 50, 70 and the lower diffusion region 30, 60, 80 has a flat surface shape. That is, the advantageous effect of including the inter-electrode region 91 is capable of being provided independently from technical idea of forming the maximum point indicating the maximum of concentration in the impurity concentration profile of the lower diffusion region 30, 60, 80.

The invention claimed is:

1. A semiconductor device comprising:
a semiconductor substrate having a diode formation region;
an upper diffusion region of a first conductivity type provided on a surface layer of a main surface of the semiconductor substrate in the diode formation region; and
a lower diffusion region of a second conductivity type provided at a position deeper than the upper diffusion region with respect to the main surface in a depth direction of the semiconductor substrate, the lower diffusion region having a higher impurity concentration as compared to the semiconductor substrate,
wherein the lower diffusion region provides a PN junction with the upper diffusion region at a position deeper than the main surface, and has a maximum point indicating a maximum concentration in an impurity concentration profile of the lower diffusion region in the diode formation region,
wherein the upper diffusion region and the lower diffusion region are distributed in rotational symmetry with a virtual line as a symmetry axis, which passes through the maximum point and follows the depth direction,
wherein the PN junction has a recessed surface around the symmetry axis such that at least a portion of the upper diffusion region is recessed toward the main surface of the semiconductor substrate, and
wherein the symmetry axis passes through a center of the recessed surface, and a distance between the recessed surface and the main surface shortens along a continuous curvature of the recessed surface approaching the center of the recessed surface.

2. The semiconductor device according to claim 1,
wherein the upper diffusion region and the lower diffusion region are similar to each other in shape in a front view of the main surface.

3. The semiconductor device according to claim 1,
wherein the upper diffusion region and the lower diffusion region are distributed in a perfect circular shape with the symmetry axis as the center of the upper diffusion region and the lower diffusion region in a front view of the main surface.

4. The semiconductor device according to claim 1, wherein:
the lower diffusion region is provided to cover the upper diffusion region; and
a portion of the lower diffusion region is exposed on the main surface.

5. The semiconductor device according to claim 1 further comprising:

a silicide block layer provided on the main surface,
wherein the silicide block layer is provided to stride over a PN joint line between the upper diffusion region exposed on the main surface and a semiconductor region of the second conductivity type.

6. The semiconductor device according to claim 1, further comprising:
a counter electrode region of the second conductivity type provided on the surface layer of the main surface in the diode formation region and having a higher impurity concentration as compared to the semiconductor substrate; and
an inter-electrode region of the second conductivity type having a higher impurity concentration as compared to the semiconductor substrate, the inter-electrode region provided at a region between the upper diffusion region and the counter electrode region,
wherein the semiconductor substrate is the second conductivity type.

7. The semiconductor device according to claim 6,
wherein the inter-electrode region has a lower impurity concentration as compared to the maximum point of the impurity concentration in the lower diffusion region.

8. The semiconductor device according to claim 6,
wherein the inter-electrode region is provided as an impurity region independent from the lower diffusion region and the counter electrode region.

9. The semiconductor device according to claim 6,
wherein the inter-electrode region is provided by overlapping of impurity, which makes the lower diffusion region and the counter electrode region be the second conductivity type.

10. The semiconductor device according to claim 1,
wherein the maximum point indicates the maximum concentration in the impurity concentration profile of the lower diffusion region in the depth direction and a radial direction of the diode formation region.

* * * * *